(12) United States Patent
Vollertsen

(10) Patent No.: US 7,646,104 B2
(45) Date of Patent: Jan. 12, 2010

(54) STRUCTURED SEMICONDUCTOR ELEMENT FOR REDUCING CHARGING EFFECTS

(75) Inventor: Rolf-Peter Vollertsen, Eborsberg (DE)

(73) Assignee: Infineon Technologies A.G., Munich (DE)

( * ) Notice: Subject to any disclaimer, the term of this patent is extended or adjusted under 35 U.S.C. 154(b) by 278 days.

(21) Appl. No.: 11/314,538

(22) Filed: Dec. 20, 2005

(65) Prior Publication Data
US 2006/0097253 A1 May 11, 2006

Related U.S. Application Data

(63) Continuation of application No. PCT/EP2004/050884, filed on May 21, 2004.

(51) Int. Cl.
*H01L 23/485* (2006.01)

(52) U.S. Cl. ............ 257/786; 257/758; 257/774; 257/784; 257/E23.02

(58) Field of Classification Search ......... 257/382–385, 257/750–766, E23.142, E23.145, 773–776, 257/784, 786, E23.019, E23.02, E23.015
See application file for complete search history.

(56) References Cited

U.S. PATENT DOCUMENTS

| | | | | |
|---|---|---|---|---|
| 5,053,850 A | * | 10/1991 | Baker et al. | 257/786 |
| 6,306,749 B1 | * | 10/2001 | Lin | 438/612 |
| 6,844,631 B2 | * | 1/2005 | Yong et al. | 257/786 |

FOREIGN PATENT DOCUMENTS

| | | |
|---|---|---|
| DE | 261 672 A1 | 11/1988 |
| DE | 290 290 A5 | 5/1991 |
| EP | 1 061 580 A2 | 12/2000 |
| JP | 05235085 | 10/1993 |

* cited by examiner

*Primary Examiner*—Marcos D. Pizarro
(74) *Attorney, Agent, or Firm*—Brinks Hofer Gilson & Lione

(57) ABSTRACT

A semiconductor circuit element for reducing undesirable charging effects for a connection element of test structures for semiconductor circuits is disclosed. A surface of a semiconductor circuit element has interconnect structures that are electrically insulated from the remainder of the surface of the semiconductor circuit element, where exclusively the interconnect structures are connected to semiconductor circuit elements arranged downstream.

11 Claims, 2 Drawing Sheets

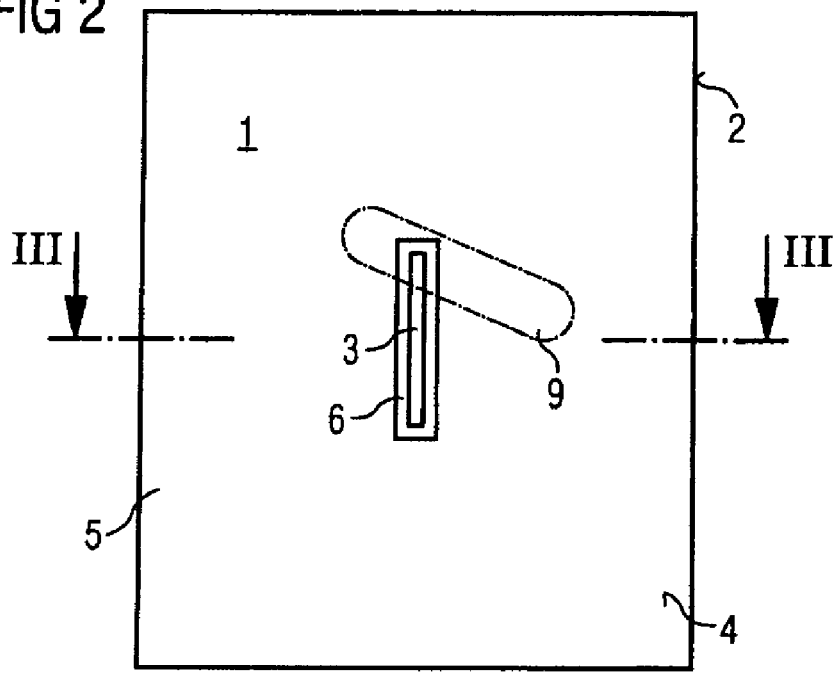
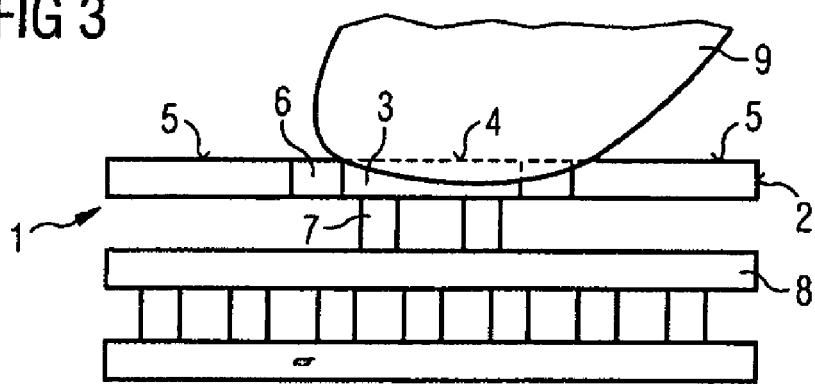
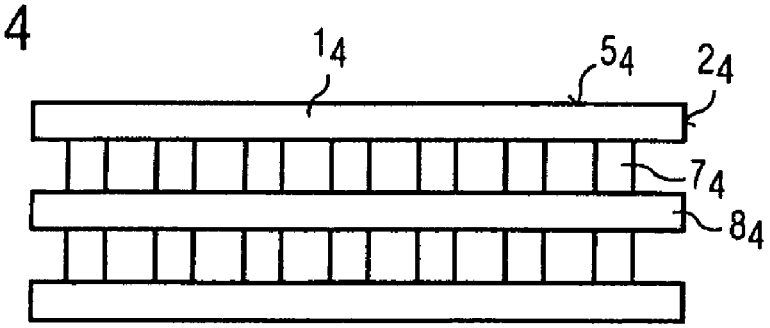
PRIOR ART

STRUCTURED SEMICONDUCTOR ELEMENT FOR REDUCING CHARGING EFFECTS

PRIORITY AND CROSS REFERENCE TO RELATED APPLICATION

This application is a continuation of International Application No. PCT/EP2004/050884 filed May 21, 2004, which claims priority to German application 103 28 007.3, filed Jun. 21, 2003, both of which are incorporated in their entirety by reference herein.

BACKGROUND OF THE INVENTION

1. Field of the Invention

The present invention relates to a semiconductor circuit element for reducing undesirable charging effects, and in particular to a connection element of test structures for semiconductor circuits, such as test structures for a technological process control for measuring and evaluating technological and electrical parameters at specific technological points in time.

2. Description of the Related Art

As an example, during production of DRAM memory circuits, it is possible to monitor the quality of the gate oxides by means of measurements of the breakdown dielectric strength and the quality of poly-Si or Al interconnects with regard to the frequency of interruptions or short circuits as sampling in the manufacturing process. By utilizing special masks in the technological section patterning on one or more wafers, instead of the circuits, test structures are to be produced which have experienced identical treatment in all of the processing steps and, consequently, do not contain any further influencing variables. Another, equivalent possibility frequently used is to generate test structures in a dicing channel in-between the product chips, without wasting productive area.

A test structure for integrated circuits for monitoring insulation in integrated circuits and in which electrically conductive connections between insulation regions and substrate dopings and also the electrical insulation between insulation regions that are isolated from one another can be assessed during and after the conclusion of the wafer processing.

In order to be able to access the test structures, they have to be electrically connected to external (or off-wafer) evaluation circuits. Connection elements are required for this purpose. Connection elements of this type are known as so-called pads.

Pads of this type, by virtue of their physically required size, are significant antennas which may collect undesirable charges during the fabrication process, for example during plasma or implantation processes, and transfer them to test structures. Said charges may lead to damage to the gate oxide of transistor or gate oxide test structures. In practice, cases have become known in which a charging problem not relevant to the product has been simulated by the undesirable antenna effect of a pad. In order nevertheless to be able to expediently utilize the test structure, it is desirable to reduce the charge collected by the pad.

SUMMARY OF THE INVENTION

The present invention is based on the objective of avoiding the disadvantages of conventional pads and of providing a semiconductor circuit element that reduces undesirable charging effects and which, in particular in fabrication processes, constitutes a connection element for test structures in which the area that is effective as an antenna is reduced. The present invention reduces the area of the semiconductor circuit element that is effective as an antenna and, as a result, charging is reduced and the test structure is again relevant to the product, so that it can once again be utilized for the purposes for which it was designed. At the same time, the invention may be designed to maintain the highest contact probability possible.

Instead of using conventional semiconductor circuit elements as pads, interconnect structures are etched into the pad. Only these interconnects are connected to the test structure— and not the unpatterned remainder—, as a result of which the antenna ratio decreases by a factor of approximately 100 depending on the patterning of the pad and the damaging effect is correspondingly reduced.

An advantage of the semiconductor element according to the invention is that the surface of the semiconductor circuit element has interconnect structures that are electrically insulated from the remainder of the surface of the semiconductor circuit element, and that exclusively the interconnect structures are connected to semiconductor circuit elements arranged downstream.

A further advantage can be seen in the fact that on the surface of the semiconductor circuit element, the permissible area free of interconnect structures can be designed in such a way that it is not greater than the expected minimum contact area of a contact needle when making contact with the semiconductor circuit element.

The semiconductor circuit element may be used as a connection pad for test structures, but it may also be formed as a protective structure for charge-sensitive layers. The semiconductor element according to the invention may also be used to generate test structures in a dicing channel in-between the product chips, without wasting productive area.

Further advantages are afforded if the surface of the semiconductor circuit element is formed in metallic fashion, it being particularly advantageous if the metallic surface of the semiconductor circuit element is formed by a soft metal, such as an aluminum layer.

The semiconductor circuit element can be produced in a particularly simple manner if it is patterned by etching, the etching structure of the semiconductor circuit element being formed by trenches whose trench width is a fraction of the width of the interconnect and is equal to a minimum permissible metal-metal distance or a multiple of said distance.

In the application of the semiconductor circuit element, it is advantageous if the trenches are bridged between interconnect structures that are electrically connected to semiconductor circuit elements arranged downstream and surface regions of the semiconductor circuit element that are not electrically connected to semiconductor circuit elements arranged downstream, when making contact with the surface of the semiconductor circuit element by means of contact needles. When making contact with the surface of the semiconductor circuit element by means of contact needles, after the contact needles have been emplaced, a short circuit may arise between the connected and non-connected surface regions, which short circuit is not harmful, however, but rather is welcome because it reduces the contact resistance.

It is sufficient in some applications if at least one partial region of the surface of the semiconductor circuit element is provided with an interconnect structure. However, the effort on alignment rises in this case, which can be accepted if the premise is upon reducing the antenna ratio.

DESCRIPTION OF THE DRAWINGS

The invention is explained in even greater detail below with the aid of exemplary embodiments with reference to the drawings.

FIG. 2 shows a simple variant of an embodiment of the invention;

FIG. 3 shows a diagrammatic cross section (not to scale) through a structure in accordance with FIG. 2; and FIG. 4 shows a cross section through a structure according to the prior art.

DESCRIPTION OF THE PREFERRED EMBODIMENTS

Figure 1:
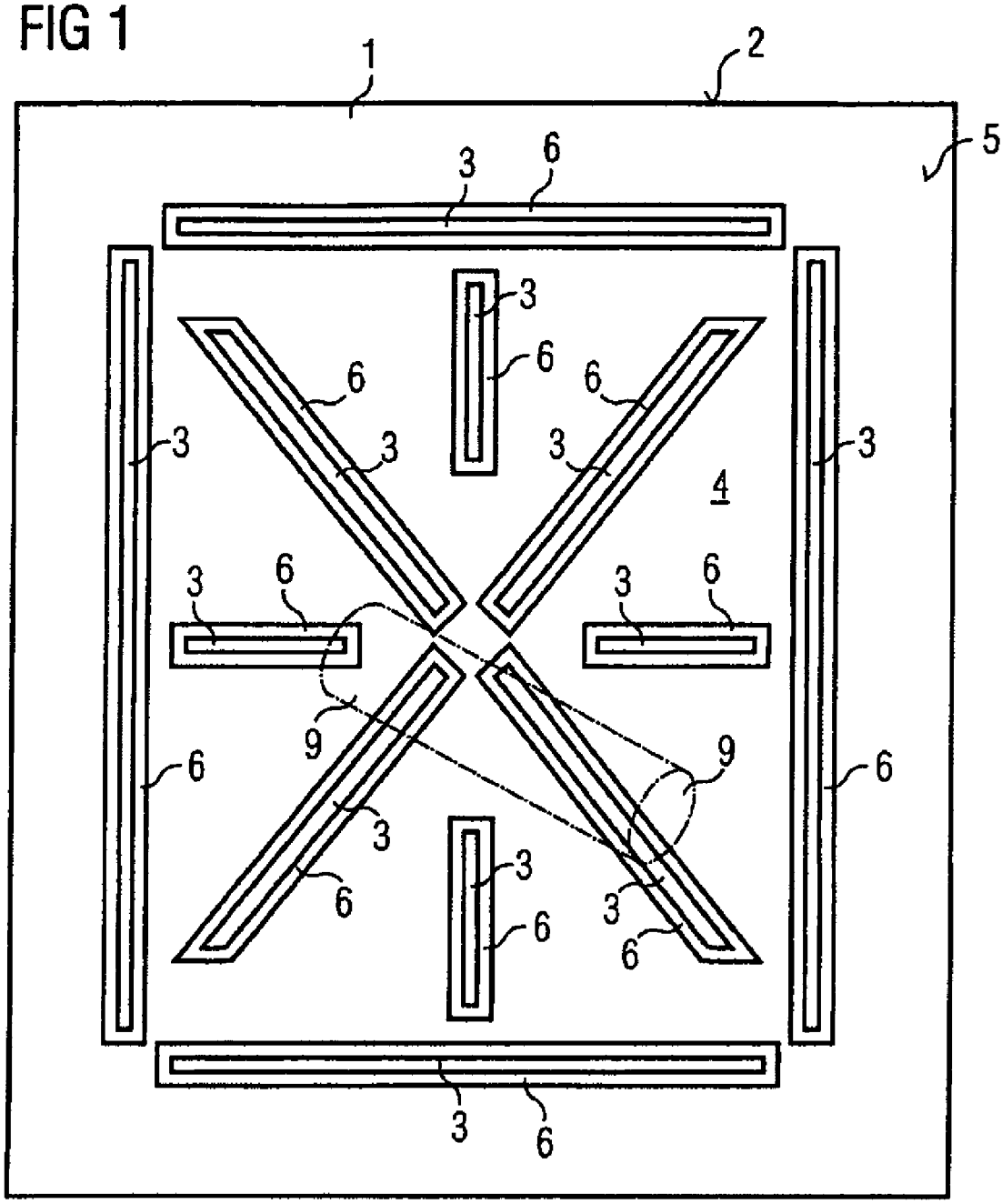
FIG. 1 shows a structure according to an embodiment of the invention, illustrated in highly diagrammatic and enlarged fashion.

Identical, functionally identical, or similar elements and signals are referred to with the same reference symbols in the Figures unless stated otherwise.

A structure illustrated in highly diagrammatic and enlarged fashion in FIG. 1 represents a semiconductor circuit element in the form of a connection pad 1 for a test structure. The outer contour line 2 represents the pad contour of a connection pad 1, which also corresponds to the pad contour of a conventional connection pad, which in reality has e.g. a size of approximately $50 \times 70\ \mu m^2$. This area of approximately $50 \times 70\ \mu m^2$—if it is unpatterned in accordance with the prior art—constitutes a significant antenna area for a semiconductor circuit arranged downstream if, as is customary in the case of the prior art, it is connected to the semiconductor circuit arranged downstream. Such an antenna collects charge during plasma or implantation processes and transfers it to the connected semiconductor circuit, which may lead to damage to the gate oxide of transistor or gate oxide test structures. A charging problem not relevant to the product may be simulated by the undesirable incidence of charge. In order nevertheless to be able to expediently utilize test structures, the charge collected by the connection pad 1 must be reduced, to which the invention contributes through the patterning of the surface of the pad and corresponding adjustment of the connections from this metal to the level below.

Interconnects that are etched into the surface 4 are designated by the reference symbol 3. Between the interconnects 3 and the unpatterned remainder 5 of the surface 4 of the connection pad 1, trenches 6 arise as a result of an etching process. Said trenches 6 electrically isolate the interconnects 3 from the metallic remainder 5 of the surface of the connection pad 1.

The trenches 6 are illustrated by the lines running parallel to the contours of the interconnects 3. The illustration in the drawing is not to scale in all the Figures, nor is it proportional to the respective other Figures. Each of the interconnects 3 is surrounded all around by an associated trench 6 which electrically isolates the interconnect 3 completely from the non-patterned remainder 5 of the surface. The width of the interconnects 3 is chosen such that it corresponds to the customary width of leads between a pad 1 and a test structure to be connected; these are e.g. approximately 1.5 µm. These dimensions are defined in so-called design rules for the design of semiconductor switching elements, but the invention is not restricted to patterning dimensioned in this way. It may accordingly also have other dimensions. Furthermore, it is expedient and advantageous, but not mandatory, to fix the width of a trench 6 at approximately 2 to 3 times the minimum distance, which, in accordance with the aforementioned design rules, is regarded as the minimum allowed distance between two adjacent metal areas.

The width chosen for the trenches 6 is intended to ensure rapid and complete isolation of the interconnect 3 from the pad 1 during etching. On the other hand, however, the width of the trenches 6 should not be much greater than a few micrometers (µm), in order to support short-circuiting by smeared soft metal, such as aluminum, of the surface 4 or 5 upon emplacement of a contact needle 9, in which case the material of the surface may, of course, also be a material other than aluminum.

The aforementioned smearing of the interconnects 3 with the surface material of the remainder 5 of the surface is in no way harmful, but even desirable.

The heart of the invention is after all—as already mentioned a number of times—reducing the active antenna area of a connection pad 1 during processing. This is effected by the patterning of the surface of the pad 1 with the aid of the interconnects 3 which are isolated from the remainder of the surface of the pad by etched trenches 6. Only these interconnects 3 are electrically connected to the semiconductor circuit elements 8 arranged downstream thereof. For this purpose, in the contact plane 7 lying below the metal plane of the pad 1 (see FIG. 3), care must be taken to ensure that only the interconnects 3 are electrically connected to the semiconductor circuit elements 8 arranged downstream. The remainder 5 of the surface is not permitted to be electrically connected to the semiconductor switching elements 8 arranged downstream before measurement.

FIG. 4, which illustrates the prior art, shows a likewise highly diagrammatic cross section through a semiconductor component. In principle it constitutes the same semiconductor circuit element as in accordance with FIG. 3, but the surface of the pad $1_4$ is not patterned, and it is accordingly subject to the disadvantages of the prior art. All elements which are of identical type or act identically have the same reference symbols in FIG. 4, but to distinguish them they are supplemented by the corresponding index numeral "$_4$", which is intended to indicate their use in FIG. 4. Thus, in the case of the prior art in accordance with FIG. 4, a pad $1_4$ is shown which with the entire surface produces a comparatively large antenna area, which has a correspondingly harmful effect with regard to the charging effects that are to be expected. Below the pad surface $5_4$, all the contacts are present in the contact plane $7_4$ in order that the pad $1_4$ is electrically connected well to the semiconductor circuit element $8_4$ arranged downstream.

For comparison, it can clearly be discerned in FIG. 3 that there, in the contact plane 7, only the interconnect 3 is electrically connected to the semiconductor circuit element 8 arranged downstream, as a result of which the effective antenna area of the pad I is reduced to the surface of the interconnects 3.

In the case of the pads 1 patterned according to the invention, however, making contact with the pad I by means of contact needles 9, which serve for electrically connecting the pad I to the evaluation circuit situated outside, constitutes a certain problem. There is a contradiction here, which, however, is likewise resolved by the invention's configuration of the pad 1. A conventional contact needle 9 has a contact area of approximately 10 µm diameter. The diameter depends on the probe card type used and is subject to variation. In the case of the prior art, the contact needle is placed anywhere onto the surface $5_4$ of the pad $1_4$ without any problems and the electrical contact to the pad $1_4$ and the semiconductor circuit element $8_4$ arranged downstream is produced. In the case of a pad 1 according to the invention, however, only the interconnects 3 are electrically connected to the semiconductor circuit element 8 arranged downstream. In order to reliably make contact with the semiconductor circuit elements 8 arranged downstream, the contact needle 9 would accordingly have to be placed exactly onto an interconnect 3. Since in practice this is scarcely possible or possible only with a disproportionately high effort on alignment, however, the surface 4 of the pad 1 is patterned in such a way that no area region which is larger than the diameter of approximately 10 µm of the imprint the contact needle 9 can form on the patterned surface 4 of the pad 1. Thus, the regions of the so-called remainder 5 of the surface which are not electrically connected to the semiconductor circuit elements 8 arranged downstream ought nowhere to be larger than approximately 10 µm in diameter for the probe card type used her. For the sake of better understanding, FIG. 1 depicts two end positions of a contact track of contact needles 9 (here, too, again not to scale!) and it can be discerned that even with course alignment, at least one interconnect 3 is always hit by the contact area of a contact needle 9. The shown probe imprint is a result of the probe needle sliding across the pad. Other probe cards may show different behavior and the pad may need to be patterned accordingly.

A further advantageous effect in the case of the pad 1 according to the invention resides in the fact that the regions of the surface 5 of the pad 1 which are not electrically connected to the semiconductor circuit elements 8 arranged downstream can also be utilized for better contact-making. The contact needle 9 placed onto the surface 4/5 of the pad 1 short-circuits the interconnect 3 hit and the likewise covered regions of the non-connected surface 5 of the pad 1. The short-circuit after the emplacement of the contact needle 9 reduces the contact resistance, but is not harmful with regard to undesirable charging because the non-connected part 5 of the surface of the pad 1 is then no longer effective as an antenna.

In order to obtain such an effect, it must be ensured in the contact plane 7 that only those contacts are maintained such as are required for the electrical connection of the interconnects 3 to the semiconductor circuit elements 8 arranged downstream. The patterning of the contact plane 7 must accordingly essentially correspond to the patterning of the surface of the pad 1. In this case, enough contacts 7 must be maintained to connect the test structure without additional series resistance.

The exemplary embodiment in accordance with FIG. 2 illustrates that in principle one interconnect 3 suffices to advantageously realize the invention. Since, in practice, a contact needle 9 is likely to be emplaced centrally, it is also possible, with corresponding effort on alignment, to make contact with an individual interconnect 3 in the center of the surface 4 of the pad 1. Since the contact-making is not effected in punctiform fashion, but rather in sliding fashion on a track-like region, non-connected regions in the vicinity of the interconnect 3 are short-circuited during contact-making by the contact area of the contact needle 9 and contribute to the reduction of the contact resistance. Although there is a large surface of the pad 1, the active antenna area of the pad 1 can be considerably reduced during processing by means of this measure, so that the charge collected by the pad 1 is reduced by a factor of approximately 100.

The invention as is not intended to be restricted to connection pads of test structures, but is also suitable as a protective structure for charging-sensitive semiconductor components. This is to be understood to mean e.g. a semiconductor circuit element for the connection of measurement or feeding-in points in the case of capacitance-sensitive products such as a resonant circuit. The pad patterned according to the invention constitutes a semiconductor circuit element which has a small capacitance until contact is actually made with it. The semiconductor element according to the invention may also be used to generate test structures in a dicing channel in-between the product chips, without wasting productive area.

A semiconductor circuit element of this type can also be patterned in the "second" plane (i.e., in the downstream semiconductor circuit plane in accordance with FIG. 3).

I claim:

1. A semiconductor circuit element that reduces undesirable charging effects, comprising:
    a surface of the semiconductor circuit element having interconnect structures being electrically insulated from the remainder of the surface of the semiconductor circuit element, where the interconnect structures are exclusively and permanently electrically connected to semiconductor circuit elements arranged only downstream; and
    wherein the shapes of each of the interconnect structures are defined by the remainder, the shapes of the interconnect structures being substantially inverse of remainder defining each of the interconnect structures.

2. The semiconductor circuit element of claim 1, where the circuit element is configured as a connection element of test structures for semiconductor circuits.

3. The semiconductor circuit element of claim 2, where a permissible area free of interconnect structures on the surface of the semiconductor circuit element is smaller than an expected minimum contact area of a contact needle.

4. The semiconductor circuit element of claim 3, where the semiconductor circuit element is formed as a connection pad for test structures.

5. The semiconductor circuit element of claim 3, where the semiconductor circuit element is formed as a protective structure for charge-sensitive layers.

6. The semiconductor circuit element of claim 3, where the surface of the semiconductor circuit element is formed in metallic fashion.

7. The semiconductor circuit element of claim 3, where the metallic surface of the semiconductor circuit element is formed by an aluminum layer.

8. The semiconductor circuit element of claim 3, where at least one partial region of the surface of the semiconductor circuit element is provided with an interconnect structure.

9. A semiconductor element, comprising:
    means for electrically insulating interconnect structures on a surface of a semiconductor circuit element from the remainder of the surface of the semiconductor circuit element;
    means for exclusively and permanently electrically connecting the interconnect structures to semiconductor circuit elements arranged only downstream; and
    wherein the shapes of each of the interconnect structures are defined by the remainder, the shapes of the interconnect structures being substantially inverse of the remainder defining the interconnect structures.

10. The method of claim 9, where the circuit element comprises a connection element of test structures for semiconductor circuits.

11. The method of claim 10, further comprising a permissible area free of interconnect structures on the surface of the semiconductor circuit element is smaller than an expected minimum contact area of a contact needle.

* * * * *

UNITED STATES PATENT AND TRADEMARK OFFICE
CERTIFICATE OF CORRECTION

PATENT NO.        : 7,646,104 B2                                             Page 1 of 1
APPLICATION NO.   : 11/314538
DATED             : January 12, 2010
INVENTOR(S)       : Rolf-Peter Vollertsen It is certified that error appears in the above-identified patent and that said Letters Patent is hereby corrected as shown below:

On the Title Page

Item (75), replace "Eborsberg" with --Grasbrunn-- in its place.

Insert Foreign Application Priority Data --June 21, 2003 (DE).............103 28 007.3--.

Signed and Sealed this
Eighteenth Day of January, 2011

David J. Kappos
*Director of the United States Patent and Trademark Office*